(12) United States Patent
Strondl et al.

(10) Patent No.: US 6,599,400 B2
(45) Date of Patent: Jul. 29, 2003

(54) METHOD FOR THE MANUFACTURE OF COATINGS AND AN ARTICLE

(75) Inventors: Christian G.C. Strondl, Venlo (NL); Antonius P. A. Hurkmans, Taylorsville, NC (US); Gerrit Jan van der Kolk, Maarheeze (NL)

(73) Assignee: Hauzer Techno Coating Europe BV (NL)

( * ) Notice: Subject to any disclaimer, the term of this patent is extended or adjusted under 35 U.S.C. 154(b) by 0 days.

(21) Appl. No.: 09/778,657

(22) Filed: Feb. 7, 2001

(65) Prior Publication Data

US 2001/0028926 A1 Oct. 11, 2001

(30) Foreign Application Priority Data

Feb. 9, 2000 (DE) .......................................... 100 05 614

(51) Int. Cl.[7] .......................... C23C 14/35; C23F 1/00; C03C 15/00; C25F 1/00
(52) U.S. Cl. .......................... 204/192.15; 204/192.32; 216/67; 134/1.1
(58) Field of Search .................... 204/192.15, 192.16, 204/192.3, 192.32; 216/67; 134/1.1

(56) References Cited

U.S. PATENT DOCUMENTS

| | | | | |
|---|---|---|---|---|
| 5,947,710 | A | * | 9/1999 | Cooper et al. .................. 418/63 |
| 6,110,329 | A | * | 8/2000 | Holleck et al. ........... 204/192.15 |
| H1924 | H | * | 12/2000 | Zabinski et al. ......... 204/192.16 |
| 6,340,245 | B1 | * | 1/2002 | Horton et al. ................ 384/492 |
| 6,372,303 | B1 | * | 4/2002 | Burger et al. ................ 427/569 |

FOREIGN PATENT DOCUMENTS

| | | | |
|---|---|---|---|
| DE | 4434428 | 3/1996 | |
| DE | 19826259 | 12/1998 | |
| DE | 19816491 | 10/1999 | |
| EP | 0734460 | 6/1995 | |
| FR | 2682400 | 4/1993 | |
| WO | WO 99/27893 | 6/1999 | ............ A61K/6/00 |

OTHER PUBLICATIONS

Merriam–Webster's Collegiate Dictionary, 10th Ed., pp. 918 & 1091.*
ACS Abstract Ref. 133: 20482 CA.
ACS Abstract Ref. 127: 111599 CA.
ACS Abstract Ref: 124: 74978 CA.
WO 97/49840 Abstract.
ACS Abstract Ref: 114: 217634 CA.
WO 99/55929 Abstract.

* cited by examiner

*Primary Examiner*—Steven H. VerSteeg
(74) *Attorney, Agent, or Firm*—Gifford, Krass, Groh, Sprinkle, Anderson & Citkowski, P.C.

(57) ABSTRACT

The invention relates to a method for the manufacture of coatings having a low coefficient of friction on articles such as mechanical components and tools, with a layer sequence of carbon and a carbide of at least one element in the form of a metal and/or silicon and/or boron being deposited on the article by means of a PVD process. Articles which have such a layer sequence are also claimed. The coating has a low coefficient of friction, is wear-resistant and has a relatively high hardness and also relatively high elasticity.

26 Claims, 2 Drawing Sheets

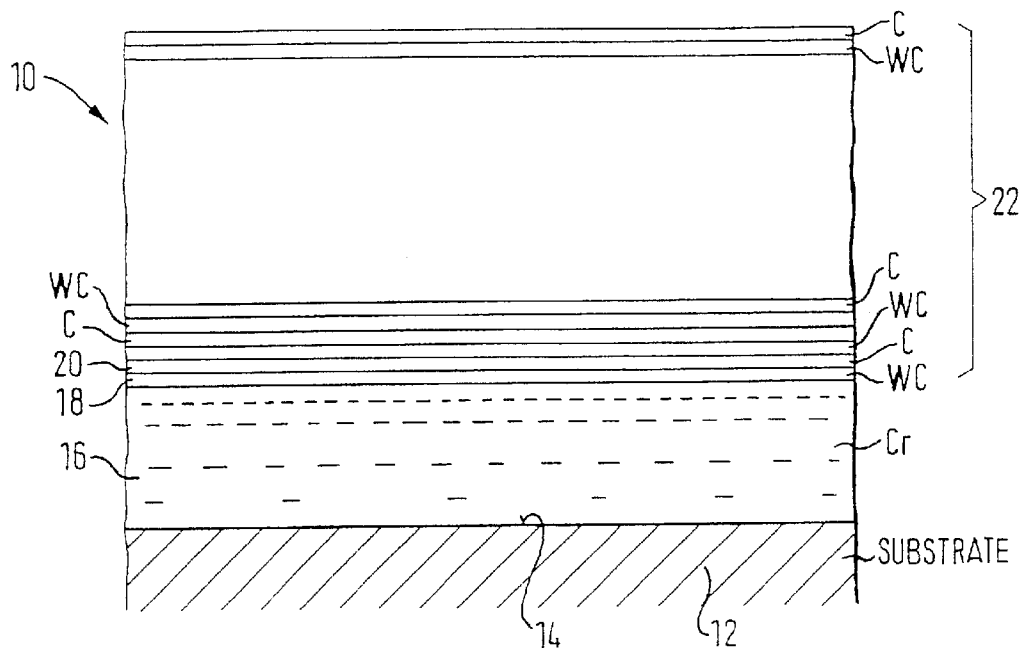
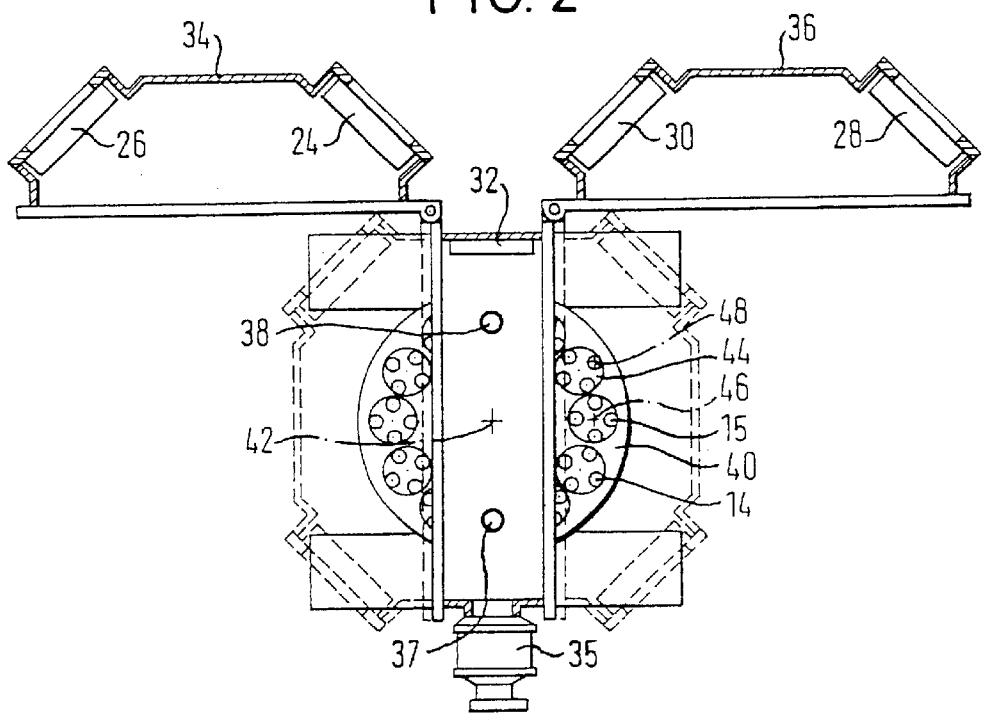

| Process step | Parameter | Value | Time |
|---|---|---|---|
| Heating | Maximum temperature | 160°C | 75 min |
| Target cleaning Ar atmosphere | Power C targets Power WC targets Power Cr target | 12 kW 7 kW 7 kW | 5 min |
| Cooling | | | 40 min |
| Etching with plasma source | Ar pressure Emission current Bias | $1 \times 10^{-3}$ mbar 30 A -200 V | 30 min |
| Cr transition layer | Power Cr target Potential of the voltage | 5 kW flow | 20 min |
| Cr/WC power increase / decrease | Cr power WC power | stepwise to 0 stepwise to 5 kW | 16 min |
| WC coating | WC power | 5 kW | 5 min |
| WC/C multi-layer | Power C target Power WC target Ar flow $C_2H$ | 12 kW 2 kW 225 sccm 40 sccm | 240 min |

Fig. 3

METHOD FOR THE MANUFACTURE OF COATINGS AND AN ARTICLE

The present invention relates to a method for the manufacture of coatings with a low coefficient of friction on articles such as mechanical components and tools and to articles having a corresponding coating.

Various proposals have already been made to achieve surfaces produced by means of PVD processes which have a relatively low coefficient of friction.

The international patent application with the publication number WO97/49840, for example, discloses the production of a super-hard surface on metallic, ceramic or organic base materials.

For this purpose, a carbide intermediate layer, e.g. made of TiC, is first deposited on the base material of the article. Then a relatively thick layer, consisting essentially of pure $sp_2$ and $sp_3$ hybridised carbon, is deposited onto the intermediate layer, with this layer being a gradient layer, in which the proportion of the $sp_3$ hybridised carbon increases in the direction of the free surface. This gradient layer is said to have a thickness between 0.5 and 5 μm. The increasing proportion of $sp_3$ bonds is produced by increasing the bias voltage up to approximately 300 V.

Exact data on the percentage-wise proportions of $sp_3$ bonds are not contained in the document. It is only expressed that a predominate proportion of $sp_3$ hybridised bonds is present at the interface to the intermediate layer in order to provide the adhesion to the intermediate layer (or to the substrate if the intermediate layer is omitted) and that the $sp_3$ bonds predominate at the free surface. The free surface of the layer thus consists of diamond-like, and thus correspondingly hard, carbon according to the statements found there.

The international application with the publication number WO99/27893, in contrast, describes an article having a coating containing carbon which consists essentially of a sequence of layers containing carbon and metal, in which the carbon—carbon bond is present within each carbon layer predominately in the form of the graphitic $sp_2$ bonds. According to the statements of this document, the intermediate layers containing carbon and metal have a period of at least 3 nm. In the specific examples, an under-layer containing metal is also used which consists of titanium or chromium and has a thickness in the range between 50 nm and 200 nm. In this proposal, the carbon layers therefore consist predominately of graphitic carbon with $sp_2$ bonds.

It is the object of the present invention to provide a method with which a coating with a low coefficient of friction and low wear, but with relatively high hardness and also relatively high elasticity can be produced on practically any article and to provide articles with such a coating.

In order to satisfy this object, provision is made for a layer sequence of alternating carbon and carbide layers to be built up on the article by means of a PVD process, with the carbide layers being formed of a carbide of at least one element in the form of a metal and/or silicon and/or boron and the carbon being produced by sputtering a target of graphite, with the method being carried out such that the layer thickness of each carbon layer of the layer sequence is in the range between approximately 1 nm and approximately 20 nm, preferably between 2 and 4 nm, with the topmost layer of the layer sequence preferably consisting of carbon and advantageously being somewhat thicker than the other layers, for example 500 nm, with the layer thickness of the carbide layers being in the range between 1 and 3 nm, preferably at approximately 2 nm and with the carbon of the carbon layer predominately having $sp_3$ bonds.

The content of $sp_3$ bonds is influenced by plasma parameters such as bias voltage and plasma density. The plasma density is controlled in part by the magnetic field strength, which should be selected as relatively high in the vicinity of the parts to be coated. This can be done via the electromagnetic coil which provides the field which is responsible for the operation of the corresponding cathode as an unbalanced magnetron. The ratio of $sp_3$ to $sp_2$ bonds can be influenced in part by the water content in the layer system.

Unlike WO99/27893, carbon layers are produced with the invention which consist predominately of $sp_3$ bonds. These layers are made relatively thin in each case, usually below 3 nm and thus with a thickness even less than the smallest thickness given in WO99/27893. The carbide intermediate layers are also relatively thin. Although the carbon layers consisting predominately of $sp_3$ bonds ought to have poor adhesion to the metal carbide layers below them, if one were to judge according to WO97/49840, it was found in accordance with the invention, surprisingly, that good adhesion is achieved even with predominately $sp_3$ bonds, but that one furthermore enjoys the advantage of the higher hardness of a carbon layer consisting of $sp_3$ bonds, and indeed—also surprisingly—with relatively high elasticity so that crack formation and peeling of the coating is largely reduced and the coating can also tolerate surface irregularities in the friction partners—without suffering mechanical damage. The coating is also resistant to impact loads.

Thanks to the relatively thin layers and the manufacture in a usual PVD plant, in which the articles to be coated on a substrate carrier are moved alternately through the vapour fluxed from the individual targets, a gradual transition is achieved from the one layer to the next, which is also advantageous for the mechanical anchoring of the layers.

The element should be selected in particular from the group of W, Ti, V, Cr, Zr, Nb, Mo, Hf, Ta and B and Si since it is possible with these to generate a highly effective coating with a relatively low coefficient of friction and low wear rates, together with high hardness and high elasticity, on the most varied articles. W, in particular, is suitable for the manufacture of carbide layers.

The present invention also comprises an article with the features of claim 16.

The following components and tools can be given as examples for articles to be coated:
  friction-type bearings, roller bearings
  various engine parts such as cam followers, camshafts, rocker arms
  parts of petrol and diesel injection systems such as pistons, needles, injection nozzles and disks,
  gearwheels in order to reduce pitting, erosion, fatigue cracks and adhesive wear,
  parts of hydraulic systems, e.g. valve slides,
  moulds, e.g. injection moulding moulds and plastic moulds.

The coating in accordance with the invention can generally be applied to all surfaces of mechanical components and articles which have low friction and which should have a wear-resistant surface coating with dry lubrication properties, e.g. CrN+carbon/metal carbide coatings can be applied to moulds (plastic moulds) in order to reduce wear and to increase anti-stick properties, which is equivalent to less friction and a saving of lubricants. The coating in accordance with the invention can also be applied to TiAlN, TiN or TiCN coated parts and tools as a lubricating coating or to drills for deep-hole boring procedures as a top coating.

The problem with the drilling of deep holes is namely the insufficient supply of cooling agent to the drill tip and the long distance to carry off the chips, which leads to an increased temperature in the flute of the drill due to the higher friction; this leads in turn to early cutting failure of the drill. In this case, the coating in accordance with the invention made of carbon/metal carbide is used as a dry lubricating agent in order to reduce cutting temperatures and to improve chip removal by reduced friction in the flute.

The total thickness of the layer sequence is in the range between approximately $0.1\mu$ and $20\,\mu m$, preferably between 1 $\mu m$ and 5 $\mu m$. For some applications, it is necessary to carry out thicker coatings, i.e. coatings with a total thickness of more than 10 $\mu m$, for example for the coating of connecting rods of internal combustion engines. It can be seen from these details that a layer sequence having approximately 30 to 3,000 individual layers is preferred in accordance with the invention. This plurality of layers can be manufactured particularly favourably by working with an apparatus having a treatment chamber in which the carbon and metal carbide targets required for the manufacture of the layer sequence are accommodated and by providing movement of the articles so that the articles run through the vapour flux of the individual targets alternately. This is known per se in connection with PVD processes. Not only simple rotations around one axis, but also complex rotations around two, three or more axes can be carried out in order to achieve a coating of all surfaces of the articles which is as uniform as possible or to achieve a directed coating of any desired surface.

It is particularly favourable to carry out the method as a non-reactive cathode sputtering process, in particular using an unbalanced magnetron. The apparatus provided for this purpose can be designed, for example, according to the European patent 0 439 561 or according to the European patent application 99 113 848.8. The magnetic field strength is selected to be relatively high so that the field strength in the product chamber has a value of typically 300 Gauss. The field strength can be changed during the coating, e.g. by the use of electromagnetic coils which surround the cathodic sources. The ratio of the proportions of $sp_3$ bonds to $sp_2$ bonds can be positively influenced by the incorporation of hydrogen in the coating.

It is also particularly favourable to carry out the non-reactive cathode sputtering process in an inert gas atmosphere, in particular in an argon atmosphere. The non-reactive atmosphere of the PVD process can moreover be supplied with hydrogen or a hydrocarbon $C_xH_y$ (x and y are integers), preferably in the form of $C_2H_2$, whereby hydrogen is taken into and incorporated into the coating as this contributes to a further reduction in the coefficient of friction.

To improve the adhesion of the carbon/carbide coating in accordance with the invention on the article, a cleaning of the surface by ion etching at the start of the process is recommended, as is the deposition of a Cr layer or a Ti layer as a transition layer between the article and the carbon layer/carbide coating in accordance with the invention. This transition layer, made for example of Cr, has, for example, a thickness in the range from approximately 1 nm to approximately 1 $\mu m$, in particular 0.1 $\mu m$ to 0.5 $\mu m$, and is preferably deposited such that the proportion of Cr in the transition layer is reduced by stages or continuously in the direction of the free surface of the article.

Particularly preferred embodiments of the method in accordance with the invention and of articles having a coating in accordance with the invention can be seen from the further patent claims.

The invention is described in more detail in the following by way of an embodiment and with reference to the drawing, in which are shown:

FIG. 1 an example for the layer build up on a substrate of a carbon/carbide coating in accordance with the invention having a low coefficient of friction;

FIG. 2 a schematic representation of a coating plant particularly suited for the carrying out of the method in accordance with the invention; and FIG. 3 a table giving the operating conditions in accordance with a preferred example.

FIG. 1 shows in schematic form an example of a multi-layer carbon and carbide layer in accordance with the invention made of alternating layer sequences 10 to create a coating on a substrate 12. The coating in the form of the layer sequence 10, which can be applied to any desired substrate 12, provides a low coefficient of dry friction of approximately 0.2, and in the most favourite cases up to or only slightly more than 0.1, with the coating having not only a low coefficient of friction, but also low wear, relatively high hardness (Vickers micro-hardness 0.025 greater than 1,000, typically 1,500 to 2,200) and also high elasticity (Young's modulus of elasticity less than 300 Gpa).

In this example, a transition layer 16 made of Cr having a thickness in the range from approximately 1 nm to approximately 2 $\mu m$, usually 0.1 $\mu m$ to 0.5 $\mu m$, and in this case approximately 0.3 $\mu m$, is located on the surface 14 of the substrate etched by means of an ion etching process using argon ions.

A layer made of WC having a thickness in the range between approximately 1 nm and 3 nm, preferably about 2 nm, as in this example, is located on the surface of the transition layer 16 remote from the substrate 12.

This WC layer 18 is followed by a carbon layer 20 and then alternately a plurality of further WC and C layers 22, with approximately 140 individual layers being provided in this example and the topmost layer being a carbon layer. The total number of the alternating C/TiC layers is not critical. It can be less than 30 or more than 3,000.

In the example shown in accordance with FIG. 1, the topmost layer is a carbon layer. The layer thicknesses of the carbon layers should preferably be selected in the range between 1 nm and 20 nm, with the topmost layer of carbon having a layer thickness of 500 nm.

Some dots can be seen inside the transition layer 16 made of Cr in the purely schematic representation of FIG. 1, with the density of the dots being higher in the uppermost region of the layer 16 in FIG. 1 than in the lower region. These dots indicate WC molecules which are deposited simultaneously during the deposition of the Cr transition layer, with the concentration of WC in Cr increasing continuously in the direction from the substrate 12 to the layer 18 and, consequently, the concentration of Cr in the transition layer falling continuously in the same direction. A step-wise increase in the WC concentration and decrease in the Cr concentration is also possible. The Cr shift serves to anchor the carbon/carbide layer sequence to the substrate 12.

It can be seen that the lines of the schematic drawing of FIG. 1 were not drawn strictly geometrically, but that each layer border has fairly small irregularities so that the individual layers also have slightly different thicknesses depending on where the measurement is made. Seen microscopically, the irregularities in question are very small and are produced from the manufacturing procedures described in more detail in the following, with the shown slight irregularity of the surface 14 of the substrate 12 being due to the manufacture of said substrate and to the etching process used (bombardment with Ar+ ions).

FIG. 2 shows a preferred coating plant which can be used to carry out the method in accordance with the invention.

This plant is shown by dashed lines in the closed state and in continuous lines with opened or wide-open chamber doors. The plant shown here, which is built up and operated basically in accordance with the European patent 0 439 561, comprises 5 targets 24, 26, 28, 30 and 32, with the targets 24 and 26 being held in a chamber wall 34 which can be pivoted open and the targets 28 and 30 being held in other chamber wall 36 which can be pivoted open.

The targets in question are in each case rectangular targets which extend vertically with respect to the drawing and are preferably operated as unbalanced magnetrons to carry out a cathode sputtering process.

This also applies to the fifth target 32, which is attached to a peripheral region of the central, fixed-position part of the chamber of the treatment apparatus which has approximately the overall shape of a parallelepiped in the closed state.

The reference numeral 35 indicates a turbomolecular pump which serves to evacuate the treatment chamber in the closed state.

The reference numeral 37 shows a feed line for an inert gas such as argon in schematic form, whereas the feed line 38 is intended for an additional gas, for example hydrogen, or for a hydrocarbon which can be advantageously incorporated into the coating in accordance with the invention.

FIG. 2 moreover shows a substrate carrier 40, which rotates around a central axis 42 on the one hand and has substrate holders 44 on the other hand which, in turn, rotate around their axes 46, so that the respective desired layer formation can be carried out by the substrates or articles passing in front of the different targets.

In this example, the targets 28 and 24 consist of graphite and thus form a carbon source. The targets 30 and 26 consist of WC and serve to generate the above-mentioned WC coating 18.

The target 32 consists of Cr and serves to generate the transition layer 16.

Although the targets 28 and 30 consist of WC in this example, they can also consist of carbides of other elements such as Ti, V, Cr, Zr, Nb, Mo, Hf and Ta or of SiC or $B_4C$. It is also possible to form the targets 26 and 30 of different carbides.

After the attachment of the substrates to be coated to the substrate holders 40 and the closing of the treatment chamber, evacuation is first carried out.

During this procedure, or shortly after it, heating is carried out until the articles 15, i.e. the substrates 12 each having a surface 14, have reached the desired operating temperature. One tries to use the highest possible temperature—while taking into account the respective material to be coated—at which the properties of the material are not subject to any deterioration. Higher coating temperatures result in shorter coating times and to denser coatings. Research results of the applicants are available which allow the presumption that an optimum coating is achieved at 200° C., sometimes at a somewhat lower temperature.

Now an Ar ion etching process is carried out with an ion energy of usually 200 eV using one of the industrially available processes such as a commercial linear plasma source or another linear ion source or an Ar glow discharge. During this treatment step, the substrate carrier 40 rotates around axis 42. The substrate holders 44 rotate around their own axes, with, if desired, the individual articles 14 also being able to be rotated around their own longitudinal axes 48.

In this way, all surfaces of the articles 15 to be coated, for example, plungers, cam followers, rocker arms, etc., are etched at least essentially uniformly with argon ions and cleaned thereby.

On conclusion of the etching procedure, the target 32 of, for example, Cr is used further in order to generate the transition layer 16. The cathode power at the Cr target 32 is gradually reduced during the generation of this transition layer. At the same time, the cathode power is increased at the WC targets 30 and 26 in order to gradually increase the ratio of WC in the transition layer 16, while the concentration of Cr atoms is generally reduced.

After generation of the layer 16, the target 32 no longer takes part in the active process. However, it can be of advantage to continue to operate the target 32 with a lower power in order to keep the target clean if the system is not provided with protective flaps. Now the layer sequence of WC and C given in FIG. 1 is deposited, with the graphite targets 28, 24 and the WC targets 26 and 30 being operated simultaneously for this purpose, and indeed as an unbalanced magnetron in each case, as mentioned above.

Since the substrates 14 on the substrate holders 44 at the substrate carrier 40 alternately pass though the vapour flux coming from the targets 24 to 30, the desired layer sequence 22 is created. The rotation of the substrates 14 around their own axes 48, around the axes 46 of the substrate holders 44 and the axis of the substrate carrier 40 results in an aperiodic multi-layer structure in which the thickness of the individual layers is not uniform, but in which the thickness of the individual carbide layers is between 1 and 3 nm, preferably at about 2 nm, while the thickness of the carbon layer is between 1 and 20 nm, preferably between 2 and 4 nm.

The process is carried out for so long until the desired overall layer thickness of the coating of approximately 1 $\mu$m is reached or until the desired number of layers is created.

Hydrogen or a hydrocarbon $C_xH_y$, preferably in the form of $C_2H_2$, can be fed into the chamber atmosphere via the feed line 38, with hydrogen being taken up into the coating, which serves to further reduce the coefficient of friction.

As a rule, a relatively low inflow quantity of $C_2H_2$ is fed into the chamber atmosphere, for example less than 20% by volume of the said gas feed, and up to 20% hydrogen is incorporated into the coating in this way. This high deposition of hydrogen with a low mass flow or volume flow of $C_2H_2$ is due to the fact that the carbon is supplied from the graphite targets while the acetylene only serves to introduce hydrogen into the coating, but not as a carbon source.

The operating parameters preferably used to produce the coating are given in the table of FIG. 3.

What is claimed is:

1. A method for manufacturing a coating having a low coefficient of friction on an article having a surface, said coating comprising a transition layer provided at said surface, a sequence of alternating carbon and carbide layers deposited on said transition layer and a topmost layer, the method comprising the steps of:

depositing said layer sequence of alternating carbon and carbide layers on said transition layer, said carbide layers being formed by sputtering of a target comprising a carbide of at least one element of the group consisting of a metal, silicon and boron, and said carbon layers being generated by sputtering of a target made of graphite, selecting a layer thickness of each said carbon layer of said layer sequence in the range between approximately 1 nm and approximately 20 nm, selecting said topmost layer to consist of carbon, selecting a layer thickness for each of said carbide layers in the range between 1 and 3 nm, and depositing said carbon layers to have a number of $sp_2$ bonds and a number of $sp_3$ bonds, a ratio of said number of $sp_3$ bonds to said number of $sp_2$ bonds being greater than 1.

2. A method in accordance with claim 1, said ratio of said number of $sp_3$ bonds to said number of $sp_2$ bonds being measured by Raman spectroscopy.

3. A method in accordance with claim 1, said metal being selected from the group consisting of W, Ti, V, Cr, Zr, Nb, Mo, Hf, and Ta.

4. A method in accordance with claim 1, said article being selected from a group consisting of mechanical components and tools.

5. A method in accordance with claim 1 and comprising the step of selecting said layer thickness of each said carbon layer to lie in the range between 2 nm and 4 nm.

6. A method in accordance with claim 1 and comprising a further step of selecting said topmost layer of carbon to have a thickness greater than said thickness of each carbon layer of said alternating sequence.

7. A method in accordance with claim 6 including the step of selecting said layer thickness of said topmost layer to be approximately 500 nm.

8. A method in accordance with claim 1 and comprising the step of selecting said layer thickness of each said carbide layer to be approximately 2 nm.

9. A method in accordance with claim 1 and comprising the step of selecting an overall thickness of said alternating layer sequence and said topmost layer to lie in the range from approximately 0.1 $\mu$m to approximately 20 $\mu$m.

10. A method in accordance with claim 9 and comprising the further step of selecting said overall thickness to lie in the range between 1 $\mu$m and 5 $\mu$m.

11. A method in accordance with claim 10 and comprising the step of selecting said overall thickness to lie in the range between 2 and 5 $\mu$m.

12. A method in accordance with claim 1, wherein said sputtering process is a non-reactive cathode sputtering process.

13. A method in accordance with claim 12, wherein said non-reactive cathode sputtering process is carried out using a plurality of unbalanced magnetrons as a sputtering source.

14. A method in accordance with claim 1 when carried out in a treatment chamber having a non-reactive atmosphere, the method comprising the further step of introducing at least one of hydrogen and a hydrocarbon $C_xH_y$, x and y being integers, into said non-reacting atmosphere in order to incorporate hydrogen into said coating.

15. A method in accordance with claim 14, said hydrocarbon $C_xH_y$ being introduced in the form of $C_2H_2$.

16. A method in accordance with claim 1 and comprising the further step of cleaning said surface of said article by means of ion etching prior to the deposition of said transition layer.

17. A method in accordance with claim 16, wherein the step of cleaning said surface of said article by means of ion etching is carried out using argon ions.

18. A method in accordance with claim 1 and comprising the step of depositing one of a Cr layer and a Ti layer on said surface of said article to form said transition layer to ensure adhesion of said alternating sequence of carbon and carbide layers.

19. A method in accordance with claim 18, wherein said surface of said article is cleaned by means of ion etching prior to depositing said transition layer.

20. A method in accordance with claim 18, wherein said transition layer has a thickness in a range from approximately 1 nm to approximately 2 $\mu$m.

21. A method in accordance with claim 20, wherein said transition layer has a thickness in the range from 0.1 $\mu$m to 0.5 $\mu$m.

22. A method in accordance with claim 18, wherein said transition layer comprises a Cr layer, said Cr layer being deposited by sputtering of a Cr target utilizing a cathode power for said Cr target and wherein said step of depositing a first said carbide layer by sputtering of a carbide target utilizes a further cathode power associated with said carbide target, the method comprising the further steps of:

reducing said cathode power associated with said Cr target during the deposition of said transition layer, and simultaneously increasing said further cathode power associated with said carbide target during the deposition of said carbide layer to generate a transition layer having a decreasing Cr concentration and an increasing carbide concentration.

23. A method in accordance with claim 1 and carried out utilizing a treatment chamber having at least one first target made of graphite and at least one second target made of one of a metal carbide, SiC and $B_4C$, said method comprising the step of rotating a plurality of articles to be coated in said treatment chamber in order to obtain said layer sequence in the form of an aperiodic multilayer structure.

24. A method in accordance with claim 1 for the simultaneous coating of a plurality of articles, said articles being rotated about one of one, two, three or more axes during said coating.

25. A method in accordance with claim 1 when carried out in a treatment chamber using a graphite target to deposit each of said carbon layers, said method comprising the steps of selecting the following process parameters for the operation of the treatment chamber:

power at said graphite target: 12 kW;

feed of argon to said treatment chamber: 225 sccm;

feed of $C_2H_2$ to said treatment chamber: 40 sccm.

26. A method in accordance with claim 1 when carried out in a treatment chamber and utilizing a WC target to generate said carbide layers; said method comprising the step of selecting the following parameters for the operation of said treatment chamber:

power at said WC target: 2 kW;

feed of argon to said treatment chamber: 225 sccm;

feed of $C_2H_2$ to said treatment chamber: 40 sccm.

* * * * *